(12) United States Patent
Widmann et al.

(10) Patent No.: US 8,045,786 B2
(45) Date of Patent: Oct. 25, 2011

(54) WAFERLESS RECIPE OPTIMIZATION

(75) Inventors: Amir Widmann, Sunnyvale, CA (US);
Mark Ghinovker, Migdal Ha'Emek (IL); Dror Francis, Haifa (IL)

(73) Assignee: KLA-Tencor Technologies Corp., Milpitas, CA (US)

( * ) Notice: Subject to any disclaimer, the term of this patent is extended or adjusted under 35 U.S.C. 154(b) by 1071 days.

(21) Appl. No.: 11/552,471

(22) Filed: Oct. 24, 2006

(65) Prior Publication Data
US 2008/0094639 A1 Apr. 24, 2008

(51) Int. Cl.
*G06K 9/00* (2006.01)

(52) U.S. Cl. ........ 382/144; 382/145; 382/149; 382/151; 359/368

(58) Field of Classification Search .................... 382/145
See application file for complete search history.

(56) References Cited

U.S. PATENT DOCUMENTS

| | | | |
|---|---|---|---|
| 5,112,129 A | 5/1992 | Davidson et al. | |
| 5,438,413 A | 8/1995 | Mazor et al. | |
| 5,712,707 A | 1/1998 | Ausschnitt et al. | |
| 5,757,507 A | 5/1998 | Ausschnitt et al. | |
| 5,805,290 A | 9/1998 | Ausschnitt et al. | |
| 5,914,784 A | 6/1999 | Ausschnitt et al. | |
| 6,023,338 A | 2/2000 | Bareket | |
| 6,848,087 B2 * | 1/2005 | Sengupta et al. | 382/278 |
| 7,175,940 B2 * | 2/2007 | Laidig et al. | 430/5 |
| 2002/0085761 A1 * | 7/2002 | Cao et al. | 382/209 |
| 2003/0021467 A1 * | 1/2003 | Adel et al. | 382/151 |
| 2003/0047694 A1 * | 3/2003 | Van Der Laan | 250/548 |
| 2003/0071996 A1 * | 4/2003 | Wang et al. | 356/369 |
| 2003/0197871 A1 * | 10/2003 | Groot | 356/497 |
| 2003/0223630 A1 * | 12/2003 | Adel et al. | 382/145 |
| 2004/0017574 A1 * | 1/2004 | Vuong et al. | 356/625 |
| 2004/0102934 A1 * | 5/2004 | Chang | 703/1 |
| 2004/0267490 A1 * | 12/2004 | Opsal et al. | 702/127 |
| 2006/0236294 A1 | 10/2006 | Saidin et al. | |

OTHER PUBLICATIONS

Semiconductor manufacturing—framework, Quin et al., Elsevier, 0959-1524, 2005, pp. 179-191.*

* cited by examiner

*Primary Examiner* — Samir Ahmed
*Assistant Examiner* — Jayesh A Patel
(74) *Attorney, Agent, or Firm* — Weaver Austin Villeneuve & Sampson LLP

(57) ABSTRACT

Disclosed are apparatus and methods for optimizing a metrology tool, such as an optical or scanning electron microscope so that minimum human intervention is achievable during the optimization. In general, a set of specifications and an initial input data are initially provided for a particular target. The specifications provide limits for characteristics of images that are to be measured by the metrology tool. The metrology tool is then automatically optimized for measuring the particular target so as to meet one or more of the provided specifications without further significant human intervention with respect to the metrology tool. In one aspect, the input data provided prior to the automated optimization procedure includes a plurality of target locations and a synthetic image of the particular target.

31 Claims, 7 Drawing Sheets

WAFERLESS RECIPE OPTIMIZATION

BACKGROUND OF THE INVENTION

The present invention relates generally to semiconductor metrology. More specifically, it relates to optimization procedures for setting up a metrology tool for optimum performance during a subsequent metrology process.

Generally, the industry of semiconductor manufacturing involves highly complex techniques for fabricating integrating circuits using semiconductor materials which are layered and patterned onto a substrate, such as silicon. Due to the large scale of circuit integration and the decreasing size of semiconductor devices, the device must comply with rigorous specification requirements prior to shipment of the device to the end users or customers.

Typically, particular parameters are measured within special test structures or targets using a metrology tool. By way of example, various targets are designed to measure misalignment or overlay errors between two adjacent layers. The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging metrology tool and an analysis algorithm is used to calculate the relative displacement of the patterns from the captured images.

The most commonly used overlay target pattern is the "Box-in-Box" target, which includes a pair of concentric squares (or boxes) that are formed on successive layers of the wafer. The overlay error is generally determined by comparing the position of one square relative to another square.

To facilitate discussion, FIG. 1 is a top view of a typical "Box-in-Box" target 10. As shown, the target 10 includes an inner box 12 disposed within an open-centered outer box 14. The inner box 12 is printed on the top layer of the wafer while the outer box 14 is printed on the layer directly below the top layer of the wafer. As is generally well known, the overlay error between the two boxes, along the x-axis for example, is determined by calculating the locations of the edges of lines c1 and c2 of the outer box 14, and the edge locations of the lines c3 and c4 of the inner box 12, and then comparing the average separation between lines c1 and c3 with the average separation between lines c2 and c4. Half of the difference between the average separations c1&c3 and c2&c4 is the overlay error (along the x-axis). Thus, if the average spacing between lines c1 and c3 is the same as the average spacing between lines c2 and c4, the corresponding overlay error tends to be zero. Although not described, the overlay error between the two boxes along the y-axis may also be determined using the above technique.

Prior to making the above described measurements to determine overlay error, the metrology tool needs to be optimized. The tool is optimized by manually adjusting operating parameters (such as focus settings, algorithm selection, etc.) so as to achieve an image having optimum characteristics, such as best contrast, etc. For instance, if the tool is used to image a particular kernel or region of interest (ROI) of the target (e.g., 16 or 18), an operator typically adjusts an imaging tool until it most closely matches what the operator perceives as an ideal image, such as the idealized image whose gray levels across the kernel in an x direction are shown in FIG. 2. Various operating parameters are continuously adjusted by an operator until the tool is optimized for a particular target. This optimization procedure is repeated for different target types.

Unfortunately, conventional optimization procedures are rather time consuming since they are performed manually, requiring significant man hours to adequately adjust the tool for various targets. Additionally, when several operators perform optimization on a tool or different tools, performance of such tool(s) is not consistent since different operators will achieve a different optimization result and the same operator may achieve different optimization results a different times for the same tool and target type.

In light of the above, it would be beneficial to implement an optimization procedure so that peak performance is consistently achieved over time for the same tool, as well as different tools. For example, it would be highly desirable to consistently imitate the most experienced application engineer's process for optimization in an automated optimization process.

SUMMARY OF THE INVENTION

Apparatus and methods for optimizing a metrology tool, such as an optical or scanning electron microscope, are provided so that minimum human intervention is achievable during the optimization. In general, a set of specifications and an initial input data are initially provided for a particular target. The specifications provide limits for characteristics of images that are to be measured by the metrology tool. The metrology tool is then automatically optimized for measuring the particular target so as to meet one or more of the provided specifications without further significant human intervention with respect to the metrology tool. In one aspect, the input data provided prior to the automated optimization procedure includes a plurality of target locations and a synthetic image of the particular target.

These and other features and advantages of the present invention will be presented in more detail in the following specification of the invention and the accompanying figures which illustrate by way of example the principles of the invention.

BRIEF DESCRIPTION OF THE DRAWINGS

The present invention is illustrated by way of example, and not by way of limitation.

DETAILED DESCRIPTION OF THE INVENTION

Figure 1:
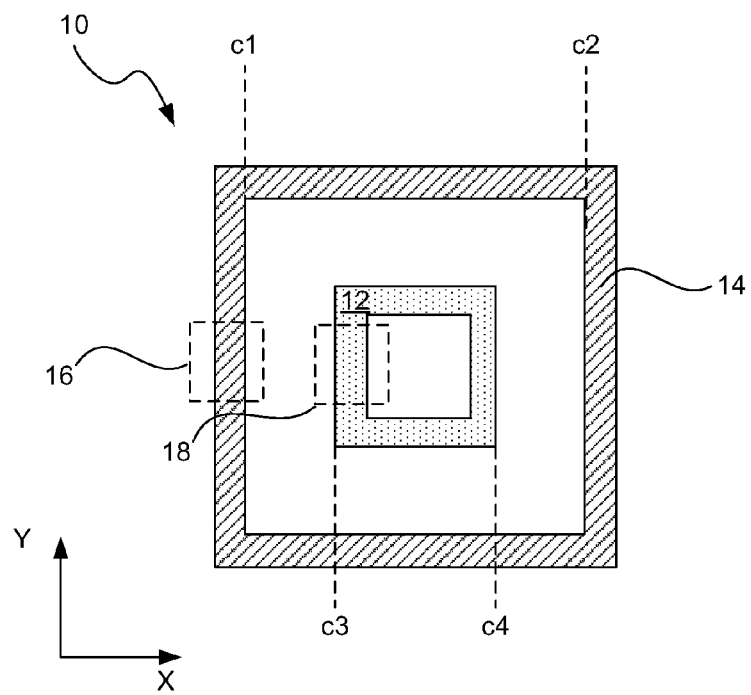
FIG. 1 is a top plan view of a box-in-box type overlay mark.
Figure 2:
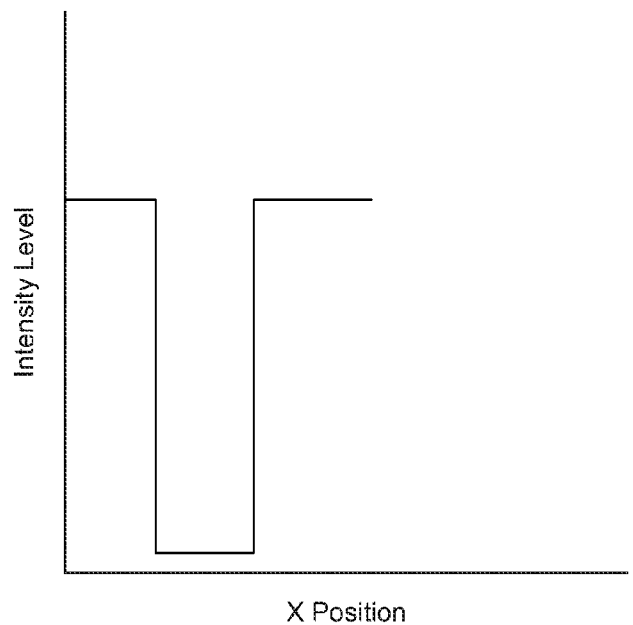
FIG. 2 represents an idealized graph of intensity level as a function of x position for a particular kernel of the box-in-box mark of FIG. 1.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Embodiments of the present invention include techniques for automatically optimizing a metrology tool, or the like, so as to achieve peak performance as predefined by a particular specification. This automated optimization procedure is performed with minimum human intervention. For instance, an operator merely sets up and initiates the optimization procedure. The automated optimization procedure then works to automatically set up the tool so as to achieve the predefined specifications with minimum or no human intervention. Although the following described techniques are described as being applied towards optical metrology tools, of course, the automated optimization techniques may be applied to scanning electron microscopes, as well as any suitable type of inspection tool.

The predefined specification may include any suitable quantifiable parameters for characterizing an image or signal measured by the tool, such as TMU, TIS, precision, matching, MAM (Move, Acquire, Measure) time, defect count, nuisance count, defect and nuisance ratio, capture rate, accuracy, accuracy of the location of the defect, etc.

During the automatic optimization procedure, the tool's operating parameters are automatically adjusted until the predefined specification is achieved. The adjusted operating parameters may include any suitable tool parameters, such as focus including a rough and a fine z position of the metrology tool, selection of one or more algorithms to apply to the tool's settings, region of interest or working zone sizing and placement, target area sizing and placement, dual aperture device position, camera or detector parameters such as frame rate, filter selection, single-grab/double-grab setting, etc.

The tool's operating parameters may be automatically adjusted to obtain an specified TMU (total measurement uncertainty) or one or more specified parameter that affect TMU. TMU depends on several factors, such as system precision (a characterization of the repeatability of measuring the same target), matching (two systems on line have same results), TIS (tool induced shift). Low TMU is desirable and its specification is typically driven by metrology tool customers or users. The tool's operating parameters may also be automatically and periodically adjusted to minimize tool drift. For example, if a tool tends to drift twice a day, this automatic optimization process is performed twice a day. Additionally, optimization may also include optimizing the tool so as to minimize having different metrology results for different materials.

Figure 3:
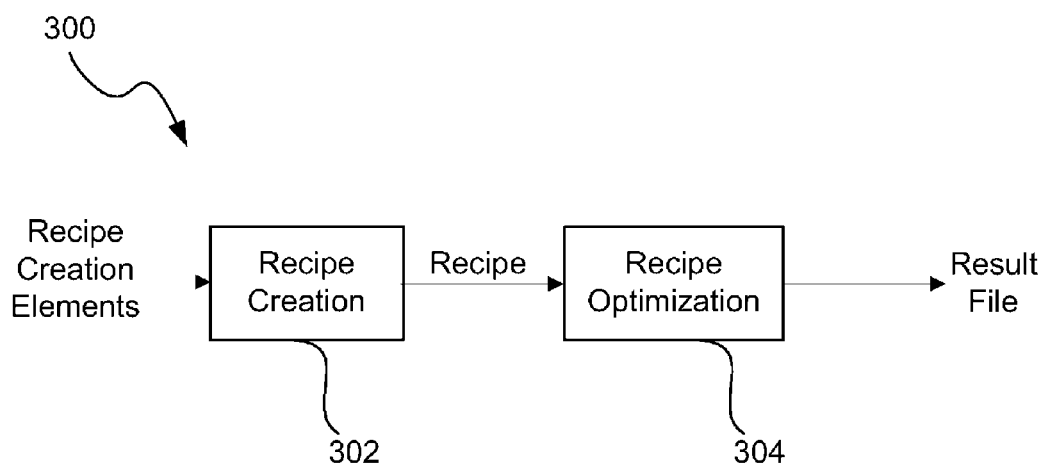
FIG. 3 is a high level, simplified flow diagram illustrating a procedure for setting up a metrology tool in accordance with one embodiment of the present invention.

FIG. 3 is a high level, simplified flow diagram illustrating a procedure for setting up a metrology tool in accordance with one embodiment of the present invention. Initially, a recipe is created in operation 302. Recipe creation 302 generally includes providing input data that may be used for the automated optimization procedure for setting up the metrology tool so it can then perform a metrology procedure on a particular wafer. By way of example, recipe creation may include forming synthetic images of the targets from the design data (e.g., GDSII data), forming or obtaining a wafer map, setting one or more thresholds, providing target type and dimension values, etc.

Figure 4:
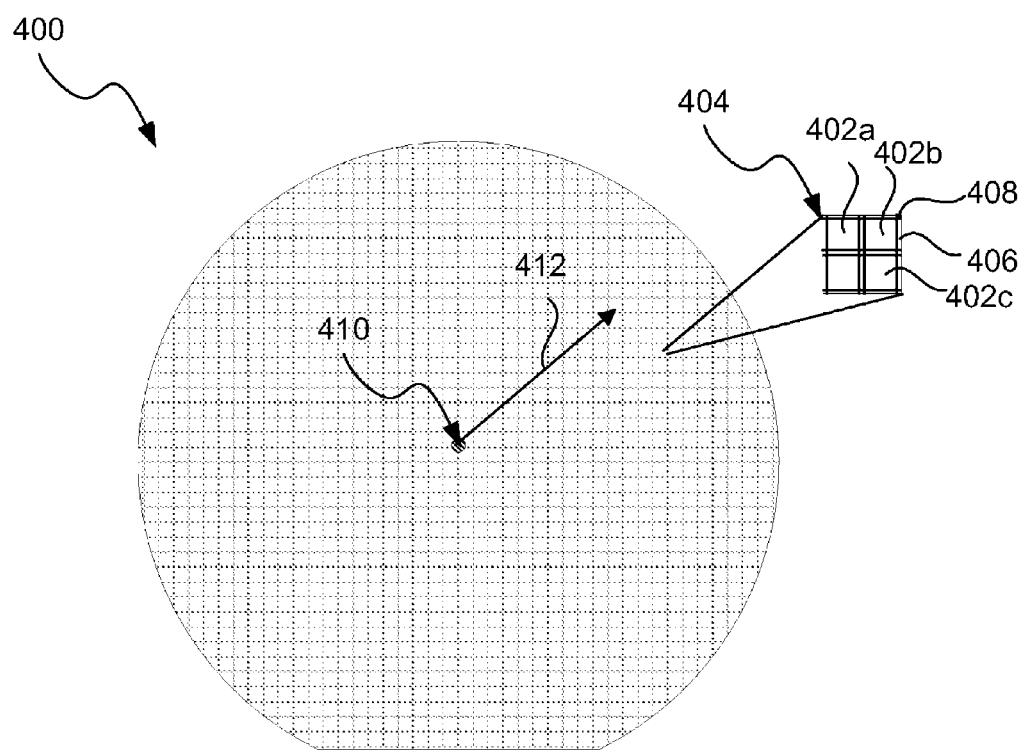
FIG. 4 is used to illustrate a wafer map of target locations on a wafer having a plurality of fields and dies disposed thereon.

The wafer map is a list of target locations. FIG. 4 is used to illustrate a wafer map that specifies multiple target locations on a wafer 400 having a plurality of fields and dies disposed thereon. The wafer is generally arranged in a grid of fields and each field includes a plurality of dies. In FIG. 4, field 404 includes dies 402. Each field also includes scribe lines that are designed to separate the dies. For instance, scribe line 408 separates dies 402b and 402c from dies on another field (not shown). The wafer map includes a list of vectors with respect to a center of wafer (COW) coordinate. Each vector specifies a particular target location. As shown in FIG. 4, vector 412 indicates the position of a target with respect to COW 410.

Although the following techniques are described in relation to utilizing a single synthetic target image, of course, multiple synthetic images would typically be used for multiple target optimizations. In general, a synthetic image is a rendition of what a target design data looks like after the design data is used to fabricate structures and then imaged with a metrology tool. The synthetic image may include an image of a target, information on its layer composition, target type, and its dimensions. The target information may be provided separately from the synthetic image. For example, the dimensions may be measured separately by the metrology tool.

The synthetic images and wafer map may be formed by any suitable manner. For example, an expert with knowledge of photolithography and image processes may create a synthetic image from the design database. Alternatively, a software utility may be utilized. For example, the RDM (Recipe Database Management) software product available from KLA-Tencor of San Jose, Calif. generates simulated images based on design data. RDM includes a feature called ARC (Automatic Recipe Creation) for creating a recipe. An operator may also generate a wafer map manually by locating the defects and compiling a list of their defect locations.

Referring back to FIG. 3, a recipe is then automatically optimized in operation 304 to thereby output results, for example, in the form of a results file. The results file may be in the form of a list of tool operating parameters or settings. Recipe optimization may include any suitable automated processes for optimizing the operation of an inspection or metrology tool for a particular set of input conditions, such as the target type, layer composition, and threshold setting. That is, the optimization processes described herein are preferably repeated for each unique set of input conditions. The optimization automatically achieves a set of predefined specifications, for example, as described above and these specifications would likely vary for each set of operating conditions.

In one implementation, the recipe optimization is divided into two stages, a training stage and an illumination optimization stage. In general, the training stage includes optimization of a precision parameter of the obtained image and the illumination optimization stage includes optimization of a tool induced shift (TIS) parameter of the obtained image. Example implementations of these two stages are represented in FIGS. 5 and 6, which are described below.

Figure 5:
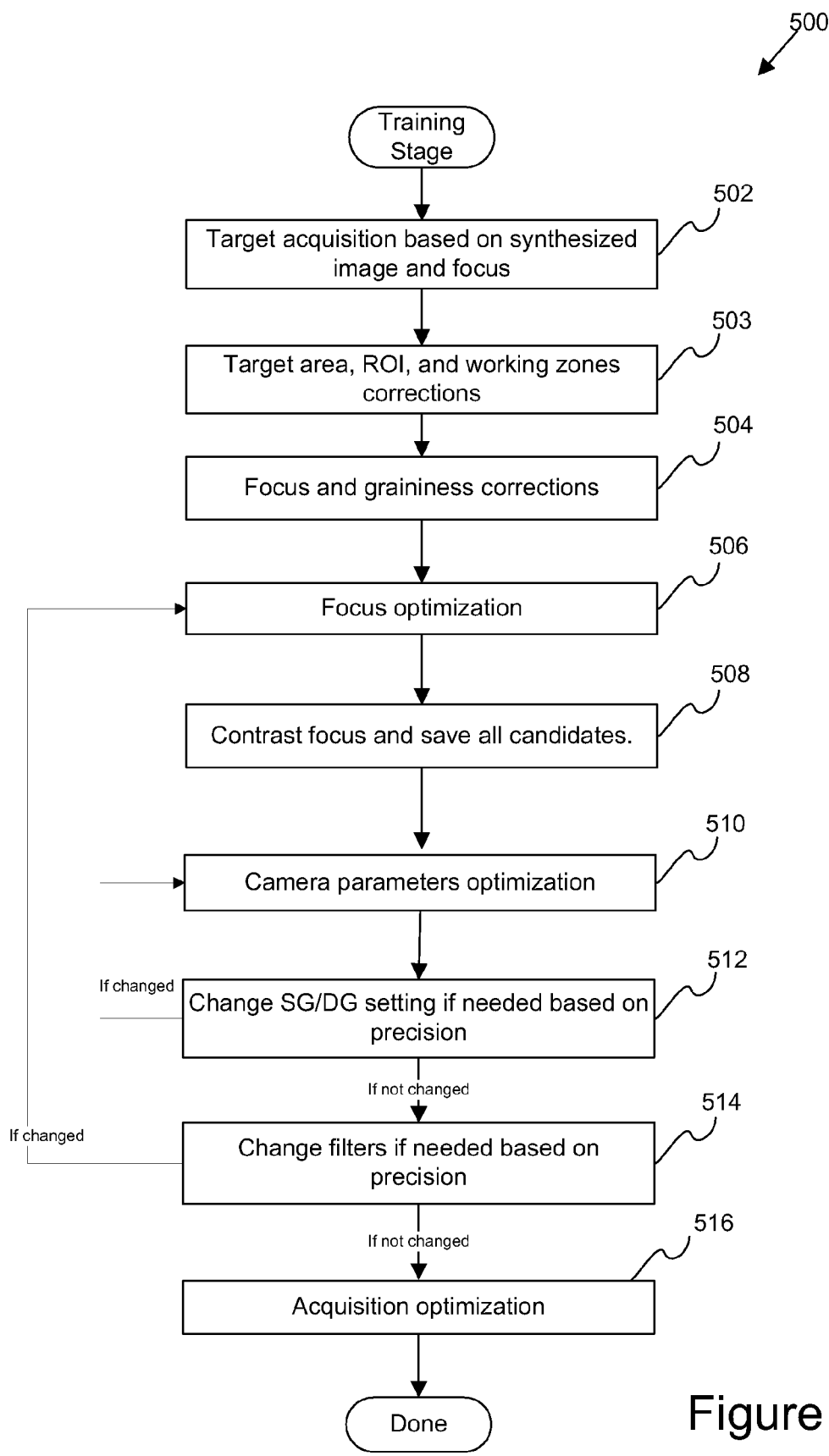
FIG. 5 is a flowchart illustrating an automated training procedure in accordance with one implementation of the present invention.
Figure 6:
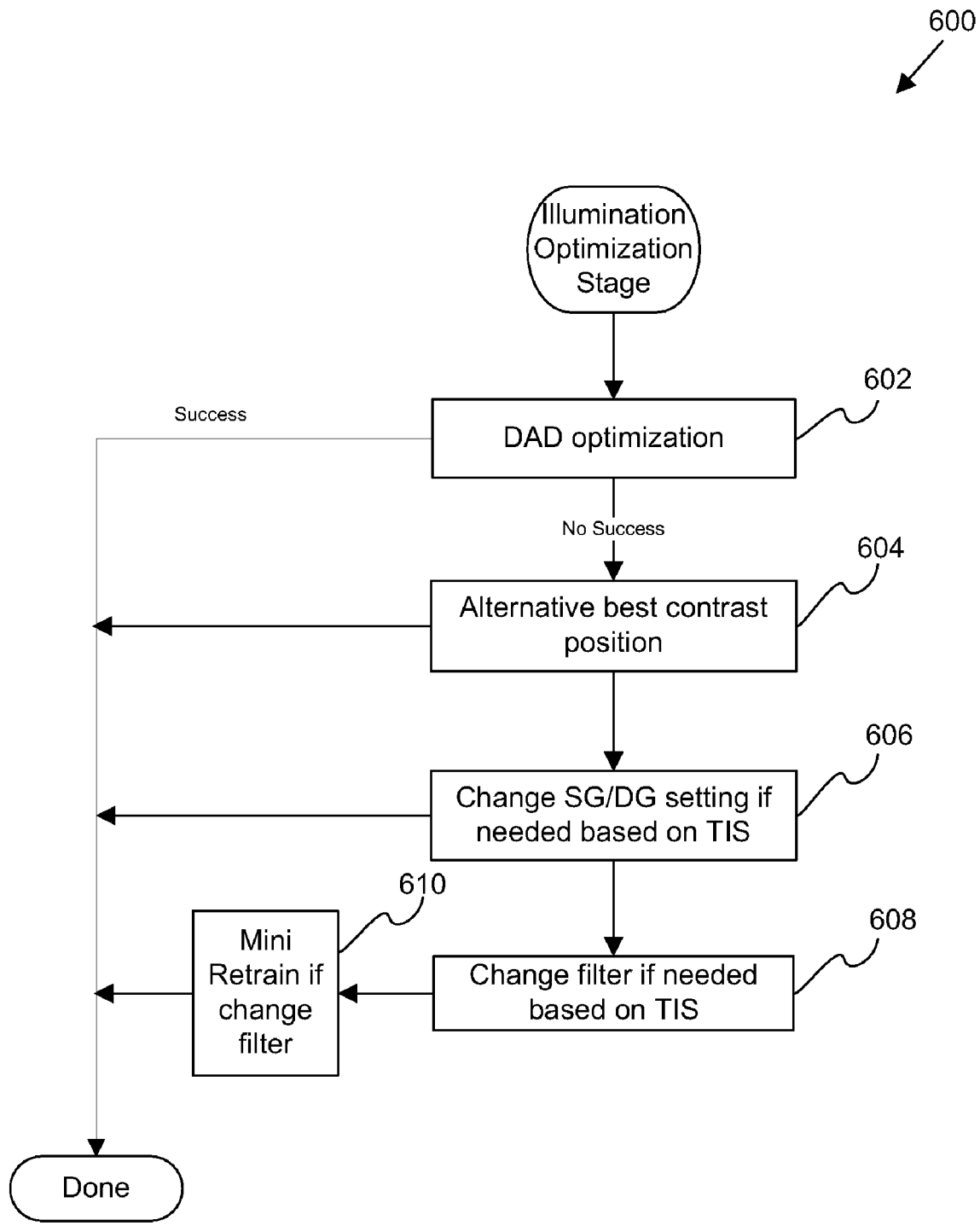
FIG. 6 is a flowchart illustrating an automated illumination optimization procedure in accordance with one implementation of the present invention.

FIG. 5 is a flowchart illustrating an automated training procedure in accordance with one implementation of the present invention. The order of these steps is merely illustrative and not meant to limit the scope of the invention. Additionally, substantially all of these steps are performed automatically with minimum human intervention. Additionally, the following procedures of FIGS. 5 and 6 may be repeated or each step performed for each target type on a wafer at any stage in the fabrication process, but perhaps with different specifications being utilized. They may also be implemented for different metrology or inspection tools.

Initially, target acquisition occurs based on the synthetic image and the acquired target is focused in operation 502. That is, a target is located based on one of the synthetic target images. The tool can be automatically set to perform image searches based on a selected synthetic image. Alternatively, this step may be based on a real reference image, for example, from another die. However, it may be more practical to use synthetic images for the target acquisition. Focusing of the acquired target may occur in any suitable manner.

The target area and ROI (region of interest) or working zones may then be set and corrected in operation 503. In general, the target area and working zones (or ROI's) define the target area to be imaged and the specific areas that require analysis during the measurement process, respectively. The target area is sized to enclose the entire area of the target as defined in the synthetic target image, as well as a predefined margin area around the target border so as to image the edges of the target structures. In the ROI correction step, an initial set of ROI and working zones may be sized and positioned over the target based on expected target type and dimensions. The target type and dimensions may have been provided, for example, by the tool operator or by different or the same software that generated the synthetic image prior to the training stage. The target dimensions may also be measured from the synthetic image.

Figure 7:
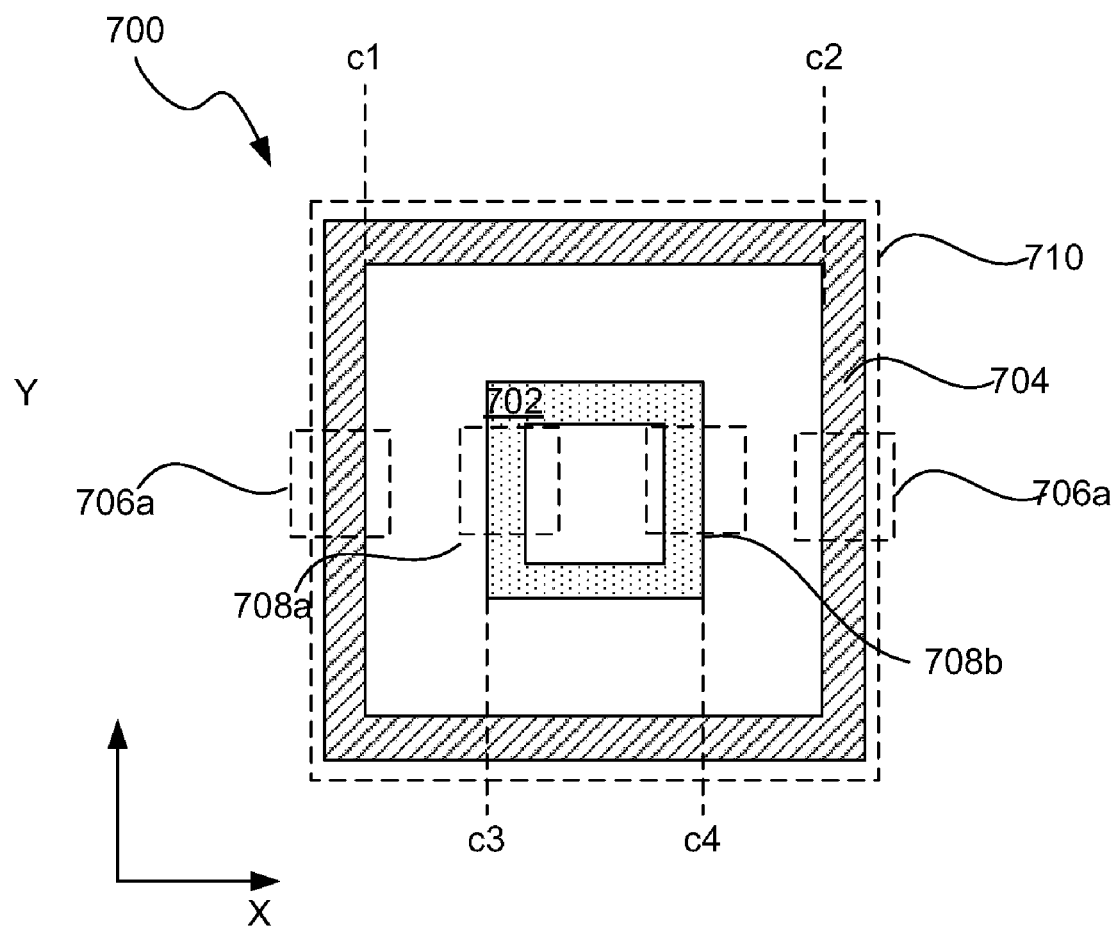
FIG. 7 illustrates a box-in-box type overlay target image on which regions of interest (ROI's) have been placed and adjusted in accordance with one embodiment of the present invention.

FIG. 7 illustrates an overlay target image 700 on which ROI's 706a and 706b have been placed on the outer box for measuring overlay in the x direction and on which ROI's 708a and 708b have been placed on the inner box for measuring in the x direction. A target area box 710 also indicates the entire target area. The target area box and ROI's are iteratively moved or resized until the sharpest image is achieved. For instance, the edges of each inner and outer box ROI are not trimmed, but included in the kernel. The edges of each inner and outer box are expected to conform to the provided dimensions of the synthetic image. That is, it may be determined whether two contrast points for an inner box kernel are spaced apart the same distance as a corresponding line width of the synthetic image. If such two contrast points are not present, the working zone is resized or moved until the two contrast points for the inner box are present within the kernel.

The focus may then be optimized in operation 506. For instance, an optimum focus may be automatically found by utilization of a focus device (FD) or any other suitable focusing mechanism such as a photodiode array (PDA). A contrast focus operation is performed and all candidates are saved at 508.

The camera parameters may then be optimized in operation 510. For instance, a frame rate or the number of images that are summed to obtain an image to analyze is set based on a MAM time specification. The MAM time specification generally defines an upper limit on the amount of time required to move to, acquire, and measure a target. Thus, the frame rate may be selected by accounting for the MAM time. For instance, a lower MAM time would mean a faster frame time. In one implementation, a table is populated with MAM time specification values and corresponding frame rates. An appropriate frame rate is then selected based on the provided MAM specification. Alternatively, an algorithm may be used that relates the MAM specification to frame rate. In sum, rules may be set up to specify when to change the camera parameters and/or focus and by how much based on other illumination parameters. For example, if the light transmission is increased, the frame rate and focus are changed by a predefined absolute or percentage amount. These rules may be determined by simulation or experimentation.

At operation 512, a single grab (SG) or double grab (DG) may be set or switched based on precision. The DG option allows one to have a different focus at two different heights with respect to the sample to be imaged, as opposed to a single z position focus setting for a SG setting. The DG setting may be utilized for a sample area that has structures with widely varying heights that would be difficult to image at an SG setting.

Selecting between an SG and a DG setting based on precision may be accomplished in any suitable manner. In one implementation, multiple images are obtained and precision is then measured initially under the SG setting and the current focus setting. In this embodiment, the SG setting was set early in the training stage, e.g., prior or during the target acquisition operation 502. Under some conditions, the image may blur at different heights of the sample causing precision to degrade as measured for the multiple images. If the measured precision is less than a predefined value, then a DG setting is used. When the SG/DG setting is changed, the camera parameters may then be optimized again with the new SG/DG setting. The SG/DG and camera parameter optimization steps may be iteratively performed until optimum results (i.e., a set of predefined specifications) are obtained.

At step 514, the wavelength of the illumination light may be changed based on precision. For example, different structure types or layer compositions may require different filters to achieve an image with an optimum precision characteristic. Said in another way, different filters may distort the image in varying degrees for different layers and/or structure types of the sample. For example, a different filter may be needed for different sets of layers. When the filter setting is switched, any number of tool parameters may require reconfiguration and optimization. For example, after a filter switch, the train process may jump back to the focus optimization step 506. Of course, filter optimization may result in using no filter for one or more layers.

Filter optimization may be implemented in any suitable manner. In a box-in-box overlay target example, multiple images are acquired for each filter. The precision of the inner box and the precision of the outer box may then be measured for each filter. The best set of precision measurements may then be used to determine the best filter for the particular overlay target. For instance, the filter that results in the best average of the inner and outer precision may be selected.

After an SG/DG and filter setting has been fixed and then optimized, an acquisition optimization may then be performed in operation 516. That is, the target is moved with respect to the imaging column to ensure that the target is placed correctly relatively to the field of view of the imaging tool. For example, the target is moved relative to the imaging column until the center of the target matches the center of the field of view. The center of the target may be predefined in the synthetic image, for example, by the designer (e.g., in the layout data) or metrology tool operator.

After the training stage, an illumination optimization stage may also commence. FIG. 6 is a flowchart illustrating an automated illumination optimization procedure in accordance with one implementation of the present invention. As in the procedure of FIG. 5, the order of these steps is merely illustrative and not meant to limit the scope of the invention. Additionally, substantially all of these steps are performed automatically with minimum human intervention. The illumination optimization procedure generally employs automated mechanisms for obtaining an optimum TIS or meeting a predefined TIS specification. Any number and types of tool adjustments may be performed to meet the desired TIS specification. Once the TIS specification is met, this optimization stage may end or other steps of the optimization may be performed to achieve a more optimum TIS.

Figure 8:
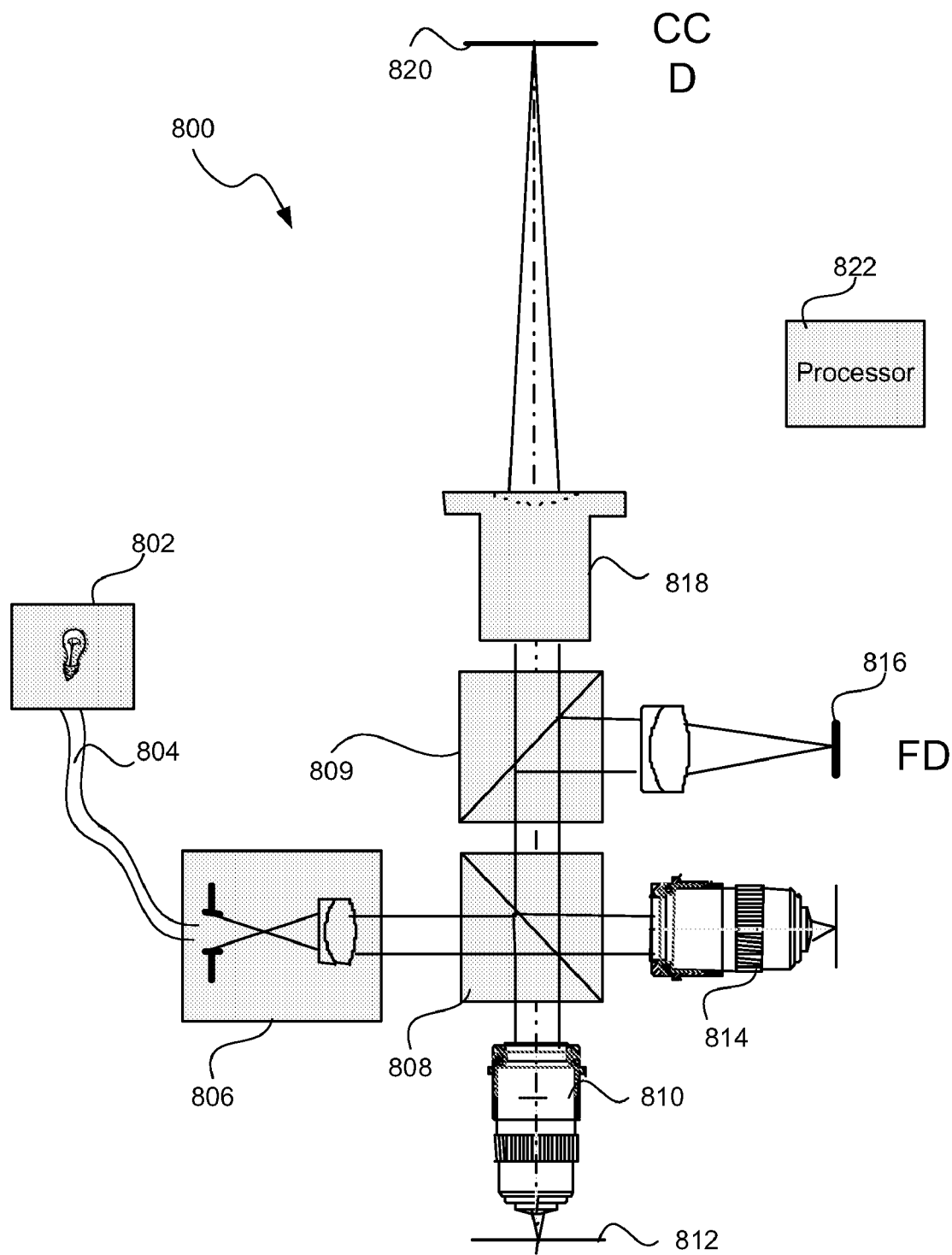
FIG. 8 is a diagrammatic representation of an optical microscopy system having a dual aperture device (DAD) in accordance with one application of the present invention.

At operation 602, a dual aperture device (DAD) of the metrology tool may be optimized. FIG. 8 is a diagrammatic representation of an optical microscopy system 800 having a DAD in accordance with one embodiment of the present invention. A light source 802 generates light that is directed through a fiber bundle 804 to a DAD 806. The light then is reflected by a first cube 808 through an objective 810 onto sample 812.

The system 800 may also include a reference objective 814, a second cube 809 and lens 818 for directing light scattered from the sample towards a detector 820 (e.g., a CCD or charged coupled device), and a focus device (FD) 816 which receives a portion of the scattered light from the second cube 809. The system 800 may also include a processor 822 that is operable to implement the automated optimization techniques of the present invention by controlling the components of the system 800 and analyzing measured results obtained from the components of system 800.

The reference objective 814 is typically present in an interference type microscope and may be in the form of a Linnik objective. The Linnik objective is typically arranged to direct the illumination beam towards a minor. The illumination light that is reflected from the mirror interferes with the light scattered from the sample 812 and the resulting interference pattern is directed towards the detector 820. Examples of interference microscopes that utilize such a reference or Linnik objective 814 and methods of use are illustrated in U.S. Pat. No. 5,112,129 to Davidson et al., U.S. Pat. No. 5,438,413 to Mazor et al., U.S. Pat. No. 5,712,707 to Ausschnitt et al., U.S. Pat. No. 5,757,507 to Ausschnitt et al., U.S. Pat. No. 5,805,290 to Ausschnitt et al., U.S. Pat. No. 5,914,784 to Ausschnitt et al., U.S. Pat. No. 6,023,338 to Bareket, which patents are all incorporated by reference as if fully set forth herein The DAD is generally moved in a plane that is perpendicular to the transmission axis of the light, e.g., in an x and y direction so as to change the coherency of the light. This movement results in the light hitting a different portion of the objective lens 810. Different portions of the objective lens 810 will yield a different TIS result. One goal is to minimize TIS by finding an optimum x and y position of the DAD. Accordingly, the DAD optimization step 602 may include iteratively moving the DAD position until TIS is minimized. In one implementation, TIS is minimized when the same two measurements are obtained from the image before and after it is rotated 180 degrees. This iterative process may be performed automatically until the best TIS is found or the TIS specification is met. For example, the DAD position is moved until the measured TIS falls below a predefined TIS value or a minimum TIS value is found for a predefined set of DAD positions.

After the DAD is optimized, an alternative best contrast position may be found in operation 604. For instance, the DAD position associated with the best TIS may not correspond to the best contrast value. Accordingly, the contrast is measured for the different DAD positions and the best combination of TIS and contrast is then utilized to select an optimum DAD position.

Next, the SG/DG setting may be changed based on TIS. That is, a SG or DG setting may result in a better TIS or a TIS that meets the specification when a DAD position was not found to result in meeting the TIS specification. When the SG/DG setting is changed, the illumination optimization process may be repeated from the beginning to again optimize the DAD position based on TIS and contrast.

The filter or filters may also be changed to get a more optimum TIS value. After a filter is changed, a minimum training stage process may also be repeated. For example, the focus and camera parameters may be optimized again based on precision. After the TIS specification or the most optimum TIS is achieved by performing one or more steps of FIG. 6, the procedure ends.

After optimization completes, one may analyze the results of the optimization for a number of applications. For example, if the optimization procedure takes a significant amount of time, the specifications may be relaxed (e.g., the predefined limit is adjusted by 5%) to alleviate the optimization time.

Additionally, after the targets are actually inspected or measured, the results may be analyzed to adjust the optimization procedure and/or alter the specification values. For instance, if a significant amount of targets are out of specification, the tool may be assessed to determine if it has been optimized as much as possible.

The optimization procedure may also be intelligently performed by first simulating how the targets will be imaged with the metrology or inspection tool using an initial set of measurement tool parameters and particular process parameters and then performing the optimization procedure on the simulated targets (e.g., optimizing precision and TIS on the simulated targets). The results of the optimization on the simulated targets may then be analyzed to then determining which optimization steps need to be performed or what range of tool parameters are likely be optimal for the real wafer. For instance, it may be determined that particular optimization steps may be skipped based on metrology or inspection simulations and optimization may occur using only specific predetermined tool parameter ranges. In one implementation, a decision tree is set up to determine which optimization steps to perform based on particular sets of measurement parameters and results obtained from a simulated measurement. In effect, optimization occurs on the simulated wafer prior to loading the wafer into the tool.

The automated optimization embodiments described herein have several associated advantages. For example, automation allows more consistent results for different tools and different wafers since the results are not dependent on one or more human operators. Additionally, automation can result in a tool being optimized in significantly less time than a human operator could achieve.

In a further aspect, part or all of the optimization procedure may be applied to only specified portions of the sample or wafer. For example, particular areas of the wafer may be identified as problem areas that require optimization. Techniques for determining which portions of the design are more susceptible to error are further described in U.S. patent application Ser. No. 11/048,630, entitled "COMPUTER-IMPLEMENTED METHODS FOR DETECTING DEFECTS IN RETICLE DESIGN DATA", filed 31 Jan. 2005 by Zain K. Saidin et al, which application is herein incorporated by reference in its entirety for all purposes. In another aspect, the targets can be formed from dummy structures or be part of the device structures. The targets can be located any where on the wafer, such as the scribe line or active die region.

In embodiments of the present invention, the metrology (or inspection) tool is optimized for a particular target. This tool optimization may be further enhanced by first optimizing the target for the particular process and tool by utilizing an automated process, such as simulation. By way of background, semiconductor structures, including target structures, are becoming smaller and more complex and, hence, it is increasingly challenging to print and etch a target that is resolvable by a metrology tool. That is, it is becoming increasingly difficult to estimate how each target will look after fabrication and imaging. Additionally, the process window is shrinking so that more restrictions are being placed on target location, pitch, etc.

Conventionally, targets are optimized so as to be resolvable for a particular process and tool by printing and etching multiple targets of varying characteristics on a wafer and then actually using the tool on the fabricated targets to see which are resolvable. The resolvable targets can then be utilized as optimum targets for the particular process and tool. Needless to say, this optimization process requires significant time and must be repeated for each process and target design change.

Figure 9:
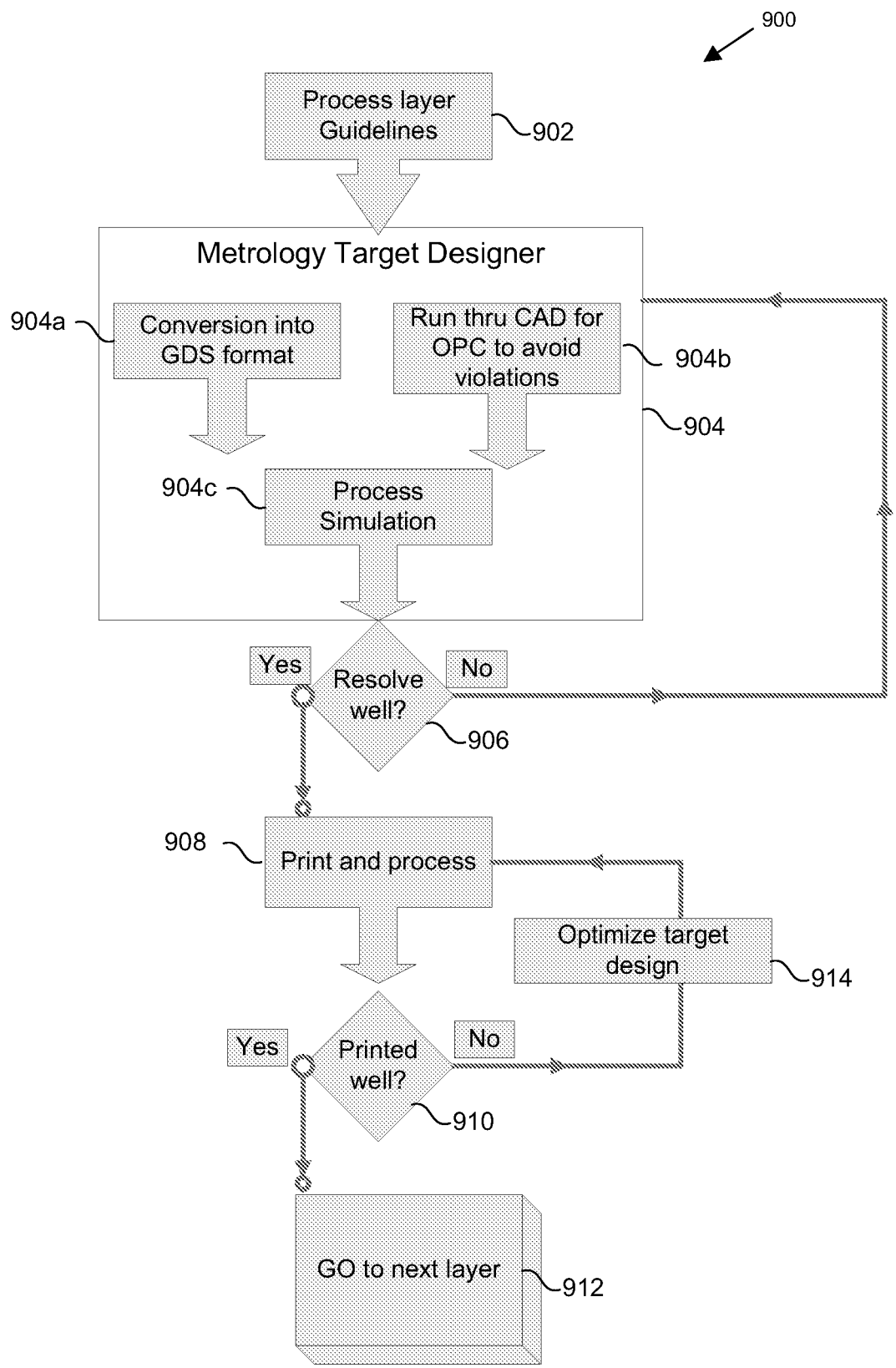
FIG. 9 is a flowchart illustrating an automated target optimization procedure that can be coupled with the tool optimization techniques of the present invention.

Accordingly, techniques for automating optimization of a target for a particular process and tool are provided herein. Any suitable techniques for automatically optimizing a target for a particular process and tool may be implemented. FIG. 9 is a flowchart illustrating an automated target optimization procedure that can be coupled with the tool optimization techniques of the present invention. Initially, a set of process layer guidelines is provided for a particular layer of the proposed target in operation 902. These guidelines include design rules that have been developed over time to serve as limits on the characteristics of the target for the particular layer. For instance, there may be limits on the pitch, line width, and spacing of structures formed in the particular layer. These guidelines are typically complex and practiced by the target designer who then verifies the compliance of his design to the guidelines by running a DRC (design rule check) on the finished layout for the particular target layer.

A Metrology Target Designer module 904 is then implemented so as to design a particular target layer. This design step includes operations performed by a human designer and a simulation tool. In the illustrated example, the Designer includes the task of converting the design into a GDSII format in operation 904a. The GDSII format may be generated by the designer by manually laying out structures in the particular target layer, utilizing cell libraries to form such structures, or implementing a software tool (e.g., Verilog) to convert functional language into a GDSII format. This design is run through a CAD tool for implementing OPC (optical proximity correction) features to avoid design violations in operation 904b.

The Designer module 904 also includes a process simulation in operation 904c. The process simulation 904c generally simulates the particular process for fabricating the particular target layer to thereby generate a simulated target and simulates use of the particular metrology tool on the simulated target to thereby generate a simulated image of the simulated target. The dimensions of the particular target design and particular process parameters, such as layer composition and lithography setup parameters, are received as input by the simulation. Any suitable software for simulating a semiconductor process may be utilized, such as TCAD available from Synopsys of Mountain View, Calif.

After the simulation, it may then be determined whether the simulated image can be resolved by the particular tool in operation 906. For example, it is determined whether the simulated image results have enough contrast and clarity for the particular metrology tool being utilized. If the simulated image is not resolvable, the target design is altered by the Metrology Target Designer 904 and the simulation is repeated for the new target design.

After a resolvable target is found, it may then be printed and processed in operation 908. It may also be determined whether the fabricated target has printed well (e.g., is resolvable) in operation 910. If the target is printed well, another target layer may be designed in operation 912 (e.g., the Metrology Target Designer module 904 is repeated). If the target has not printed well, target optimization design techniques may be utilized in operation 914. For instance, the target may be redesigned by Designer module 904. The procedure 900 may end when each target layer has been optimized for a particular metrology tool.

The automated optimization techniques of the present invention may be implemented in any suitable combination of software and/or hardware system, such as a metrology or inspection system's processor. Regardless of the system's configuration, it may employ one or more memories or memory modules configured to store data, program instructions for the general-purpose metrology operations and/or the inventive techniques described herein. The program instructions may control the operation of an operating system and/or one or more applications, for example. The memory or memories may also be configured to store layout patterns, layout constraint rules and target rules.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method for optimizing a metrology tool for measuring one or more characteristics of a semiconductor target, comprising:

(a) providing a set of specifications and an initial input data for a particular target, wherein the specifications provide limits for characteristics of images that are to be measured by the metrology tool including a TIS (tool induced shift) value limit; and (b) automatically optimizing one or more settings of the metrology tool for measuring the particular target so as to meet one or more of the provided specifications without further significant human intervention with respect to the metrology tool, wherein automatically optimizing one or more settings of the metrology tool includes adjusting a dual aperture device (DAD) position so as to meet the TIS value limit or a single-grab and double-grab (SG/DG) setting so as to meet the TIS value limit.

2. The method as recited in claim 1, wherein the metrology tool is an optical metrology tool.

3. The method as recited in claim 1, wherein the metrology tool is a scanning electron microscope (SEM).

4. The method as recited in claim 1, wherein the input data provided prior to the automated optimization step includes a plurality of target locations, a synthetic image of the particular target, a target type, and one or more dimensions of the synthetic image of the particular target.

5. The method as recited in claim 1, wherein the specifications further include a total measurement uncertainty (TMU) value limit.

6. The method as recited in claim 1, wherein the specifications further include a precision value limit.

7. The method as recited in claim 1, wherein the specifications further include a MAM (move, acquire, and measure) time limit.

8. The method as recited in claim 1, wherein automatically optimizing one or more settings includes adjusting one or more of the following: a frame rate or a filter selection.

9. The method as recited in claim 8, wherein the specifications further include a MAM (move, acquire, and measure) time limit and the step of automatically optimizing one or more settings of the metrology tool includes adjusting a frame rate from the camera parameter setting so as to meet the MAM time limit.

10. The method as recited in claim 9, further comprising:
repeating an adjustment of the frame rate if the SG/DG setting is altered; and
repeating an adjustment of the focus, SG/DG setting, and filter setting if and after the filter setting is altered.

11. The method as recited in claim 1, wherein both the dual aperture device (DAD) position and the SG/DG setting are adjusted so as to achieve a best contrast and best TIS value.

12. The method as recited in claim 8, wherein the step of automatically optimizing one or more settings of the metrology tool includes filter selection so as to meet the TIS value limit.

13. The method as recited in claim 1, wherein the automated optimization step is repeated periodically to minimize tool drift.

14. The method as recited in claim 1, wherein the automated optimization step is repeated on different metrology tools and wherein the specifications include a limit on the difference amount produced by different metrology tools.

15. The method as recited in claim 1, further comprising:
analyzing the time taken for the automated optimization step; and
adjusting the specifications based on the analysis of the time taken for the automated optimization step.

16. The method as recited in claim 1, further comprising:
repeating steps (a) and (b) for a plurality of targets;

after the metrology tool is optimized, using the metrology tool to measure the targets and obtain measurement results;
analyzing the measurement results;
determining whether to adjust the optimization step and/or the specifications based on the measurement results; and
adjusting the optimization step and/or the specifications when it is determined that such adjustment is required.

17. The method as recited in claim 1, further comprising prior to performing the automated optimization step on the particular target:
generating a simulated target image of the particular target without using the metrology tool to image the particular target;
executing the automated optimization step on the simulated target image; and
adjusting the optimization step for execution on the particular target based on the results of executing the automated optimization step on the simulated target image.

18. The method as recited in claim 1, wherein steps (a) and (b) are repeated for a plurality of targets on a wafer selected from a larger group of targets, wherein the selected targets are within areas of the wafer that are specified as being more susceptible to errors.

19. The method as recited in claim 1, wherein the particular target is formed from one or more semiconductor dummy layers.

20. The method as recited in claim 1, wherein the particular target is formed within an active device region of a semiconductor die.

21. The method as recited in claim 1, further comprising optimizing the particular target for a particular process and the metrology tool, wherein the optimizing the particular target includes (i) simulating the particular process on design data representing such particular target to generate a simulated target, (ii) simulating use of the metrology tool on the simulated target to thereby generate a simulated target image, (iii) determining whether the simulated target image is resolvable by the metrology tool, and (iv) altering the design data until the simulated target image is resolvable by the metrology tool.

22. A method for optimizing a metrology tool for measuring one or more characteristics of a semiconductor target, comprising:
(a) providing a set of specifications and an initial input data for a particular target, wherein the specifications provide limits for characteristics of images that are to be measured by the metrology tool; and
(b) automatically optimizing of the metrology tool for measuring the particular target so as to meet one or more of the provided specifications without further significant human intervention with respect to the metrology tool,
wherein automatically optimizing the metrology tool includes adjusting one or more parameters that are selected from the following: a sizing and placement of region of interest that defines an image area to be analyzed, a sizing and placement of a target area from which an image is to be obtained, a dual aperture device (DAD) position, or one or more camera or detector parameters,
wherein the metrology tool is an optical metrology tool,
wherein automatically optimizing the metrology tool includes adjusting one or more parameters that are further selected from a focus or one or more algorithms to apply to the optical tool's settings, and wherein the specifications include a precision limit and the step of automatically optimizing the metrology tool includes adjusting the focus, SG/DG setting, and a filter setting until the precision limit is met.

23. An apparatus for analyzing one or more characteristics of a semiconductor target, comprising:

an illumination source and illumination lens system for directing an incident beam towards a target;

a output lens system for directing an output beam emanating from the target in response to the incident beam;

a camera or detector for generating an image from the output beam; and a processor configured for:

(a) providing a set of specifications, including a precision limit, and an initial input data for a particular target, wherein the specifications provide limits for characteristics of images that are to be measured by the apparatus further including a TIS (tool induced shift) value limit; and (b) automatically optimizing one or more settings of the apparatus for measuring the particular target so as to meet one or more of the provided specifications without further significant human intervention with respect to the apparatus;

wherein automatically optimizing the apparatus includes adjusting a focus, SG/DG setting, and a filter setting until the precision limit is met and adjusting one or more parameters that are selected from the following: one or more algorithms to apply to the apparatus' settings, a sizing and placement of region of interest that defines an image area to be analyzed, a sizing and placement of a target area from which an image is to be obtained, a dual aperture device (DAD) position so as to meet the TIS value limit, or one or more camera or detector parameters.

24. The apparatus as recited in claim 23, wherein the incident beam and the output beams are optical beams.

25. The apparatus as recited in claim 23, wherein the incident beam and the output beams are electron beams.

26. The apparatus as recited in claim 23, wherein the input data provided prior to the automated optimization step includes a plurality of target locations, a synthetic image of the particular target, a target type, and one or more dimensions of the synthetic image of the particular target.

27. The apparatus as recited in claim 23, wherein the specifications further include a total measurement uncertainty (TMU) value limit.

28. The apparatus as recited in claim 23, wherein the specifications further include a MAM (move, acquire, and measure) time limit.

29. The apparatus as recited in claim 23, wherein the one or more camera or detector parameters include one or more of the following: a frame rate, filter selection, or a single-grab and double-grab (SG/DG) setting.

30. The apparatus as recited in claim 23, wherein the apparatus is an metrology system for measuring one or more characteristics of a semiconductor target.

31. The apparatus as recited in claim 23, wherein the apparatus is an inspection system for inspecting one or more characteristics of a semiconductor target.

* * * * *